United States Patent
Crivelli et al.

(10) Patent No.: US 7,084,032 B2
(45) Date of Patent: Aug. 1, 2006

(54) MANUFACTURING PROCESS OF AN INTERPOLY DIELECTRIC STRUCTURE FOR NON-VOLATILE SEMICONDUCTOR INTEGRATED MEMORIES

(75) Inventors: Barbara Crivelli, Milan (IT); Mauro Alessandri, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/356,351

(22) Filed: Jan. 30, 2003

(65) Prior Publication Data

US 2003/0183869 A1    Oct. 2, 2003

(30) Foreign Application Priority Data

Jan. 31, 2002    (EP) ................... 02425044

(51) Int. Cl.
   *H01L 21/336*    (2006.01)
(52) U.S. Cl. .............. 438/261; 438/257; 438/264
(58) Field of Classification Search ........ 438/201, 438/211, 257, 261, 264, FOR. 431
   See application file for complete search history.

(56) References Cited

U.S. PATENT DOCUMENTS

| | | | |
|---|---|---|---|
| 5,352,619 A | 10/1994 | Hong | 437/43 |
| 5,557,122 A | 9/1996 | Shrivastava et al. | 257/309 |
| 5,729,035 A * | 3/1998 | Anma | 257/324 |
| 5,888,870 A | 3/1999 | Gardner et al. | 438/261 |
| 5,926,730 A | 7/1999 | Hu et al. | 438/592 |
| 6,100,188 A * | 8/2000 | Lu et al. | 438/653 |
| 6,103,576 A * | 8/2000 | Deustcher et al. | 438/261 |
| 6,127,227 A | 10/2000 | Lin et al. | 438/261 |
| 6,137,132 A | 10/2000 | Wu | 257/315 |
| 6,162,684 A | 12/2000 | Chang et al. | 438/261 |
| 6,184,088 B1* | 2/2001 | Kurooka et al. | 438/264 |
| 6,362,045 B1* | 3/2002 | Lin et al. | 438/257 |
| 6,387,756 B1* | 5/2002 | Muramatsu | 438/266 |
| 6,512,264 B1* | 1/2003 | Ogle et al. | 257/324 |
| 2002/0072177 A1* | 6/2002 | Grider | 438/287 |
| 2002/0130377 A1* | 9/2002 | Khare et al. | 257/410 |
| 2003/0003656 A1* | 1/2003 | Dong et al. | 438/257 |

FOREIGN PATENT DOCUMENTS

JP        2001135824 A  *  5/2001

* cited by examiner

*Primary Examiner*—N. Drew Richards
(74) *Attorney, Agent, or Firm*—Lisa K. Jorgenson; Robert Iannucci; Seed IP Law Group PLLC

(57) ABSTRACT

A process manufactures an interpoly dielectric layer for non-volatile memory cells of a semiconductor device with an interpoly dielectric layer. The process begins with forming the tunnel oxide, and hence the amorphous or polycrystalline silicon layer, using conventional techniques. After the amorphous or polycrystalline silicon layer is surface cleansed and passivated, the surface of the polycrystalline layer is nitrided directly by using radical nitrogen. This is followed by the formation of the interpoly dielectric, either as an ONO layer or a single silicon layer, by means of the CVD technique. Masking to define the floating gate may be performed immediately before or after the direct nitridation step is carried out. The equivalent electrical thickness of the interpoly dielectric, obtained by combining the nitride oxide layer and by the following dielectric, does not exceed 130 Angstroms in either the ONO layer or the single silicon layer embodiment.

25 Claims, 3 Drawing Sheets

INTERPOLY DIELECTRIC
FLASH MEMORY APPLICATION

MANUFACTURING PROCESS OF AN INTERPOLY DIELECTRIC STRUCTURE FOR NON-VOLATILE SEMICONDUCTOR INTEGRATED MEMORIES

BACKGROUND OF THE INVENTION

1. Field of the Invention

The present invention relates to the manufacturing of semiconductor memory devices, such as non-volatile memories of the flash EEPROM (Electrically Erasable Programmable Read-Only Memories) type. Flash EEPROM memories can be erased with one operation in all the cells forming the memory.

2. Description of the Related Art

As it is well known in this particular technical field, re-programmable non-volatile memory cells, in particular flash EEPROM cells, are structured as a floating gate FETs (Field-Effect Transistors) and have a dielectric layer, called the interpoly dielectric, provided between their floating and control gate regions, this dielectric layer functioning as an insulator to the charge stored in the floating gate. The absence or presence of charge in the floating gate effectively sets the logic state of the memory, which logic state is defined as 0 or 1 in the binary code.

The above dielectric layer is obtained in different ways and made out of different materials. A common procedure is to deposit three dielectric layers successively onto the floating gate region, this region being formed by a layer of amorphous or polycrystalline silicon (polysilicon) deposited onto a thin layer of silicon oxide known as the tunnel oxide. The so obtained multiple dielectric layer comprises: a first layer of silicon oxide, a second layer of silicon nitride, and a third layer of silicon oxide. The resulting dielectric is known as the ONO or ONO interpoly dielectric, as it is shown in FIG. 1.

Within the ONO layer, the cell capability to retain its logic state is mainly guaranteed by the two layers of silicon oxide. Indeed, the nitride layer facilitates integration of the triple layer inside the flow of the device manufacturing process. During the manufacturing steps that follow the formation of the interpoly dielectric, treatments made with oxidizing species ($O_2$, O, OH, $H_2O$) are applied. The nitride acts as a barrier against the diffusion of the oxidizing species to the floating gate, since it is not permeable to said oxidizing species. Thus, its presence is effective to prevent further oxidation of the floating gate, and therefore, the thickness of the interpoly dielectric from being changed in the course of subsequent steps of the device manufacturing process. In the state of the art, the need to have a nitride layer maintained sufficiently thick to shield from subsequent thermal treatments, and the concurrent need to keep the retention capability of the ONO layer unchanged, disallows to reduce the overall electrical thickness of the triple layer below 140 Angstroms.

Instead of ONO layer, a single oxide interpoly layer may be used whenever, in specific memory cells, the interpoly dielectric is not required to be particularly thin and/or no oxidizing treatments are provided after its formation. The thickness of the interpoly dielectric is, irrespective of its composition and forming method, jointly responsible of the capacitive coupling of the memory cell. Accordingly, it enters the setting of program and erase parameters, additionally to ensuring retention of the logic state over time.

A pressing demand for increased miniaturization of electronic devices and reduced power absorption, and the consequent need for ever lower device bias voltages, is urging recourse to active dielectrics of reduced thickness at no trade-off of their performance characteristics.

It has been proposed, in prior patent specifications to the filing date of this Application, that a layer of silicon nitride be included in the manufacturing of flash memory cells. This layer is used in the ONO triple layer, and used for protection against mechanical and thermal stressing during the intermediate manufacturing steps, but is removed before the manufacturing process is completed. Such are the teachings of U.S. Pat. No. 5,352,619, for instance, which is incorporated herein by reference in its entirety.

U.S. Pat. No. 6,137,132, which is incorporated herein by reference in its entirety, discloses using the silicon nitride as an anti-reflection material for the subsequent photoetching application. According to U.S. Pat. No. 5,926,730, which is incorporated herein by reference in its entirety, the silicon nitride is provided at the interface between the bottom silicon layer and a conductive layer within an active dielectric stack.

BRIEF SUMMARY OF THE INVENTION

An embodiment of this invention provides a method of manufacturing a non-volatile memory cell, e.g., of the flash EEPROM type, with a substantially thinner interpoly dielectric than the prior art, yet capable of ensuring proper performance of the device in terms of electrical characteristics and capability to retain a programmed logic state. The combined thickness of the dielectric layers between the floating and control gate regions can be reduced at 130 Angstroms or less, thereby improving or maintaining still the cell characteristics. The cell characteristics are: good capacitive coupling of the floating gate to the control gate, small leakage through the active and passive dielectric layers, long-term retention of charge, and reduced power usage by reason of the memory cell components having lower resistivity.

The process manufactures, on a very large integration scale as well as on a single wafer, non-volatile memory devices of the flash EEPROM type having the above-outlined features.

The process interposes, between the floating gate and the ONO interpoly dielectric or the dielectric constituted only by silicon oxide, a layer of silicon nitride oxide (oxynitride) which is obtained by direct nitridation of the polysilicon surface in the floating gate region using radical nitrogen.

By nitriding the polysilicon surface directly, the overall electrical thickness of the interpoly dielectric obtained by the combination of the nitride oxide layer and the following dielectric layer can be brought down to 130 Angstroms or less in the options of ONO layer or the single silicon oxide layer (single oxide interpoly).

Another embodiment of the invention provides an interpoly dielectric layer structure that separates a floating gate region from a control gate region and includes a thin layer of silicon nitride oxide formed above the floating gate region.

The features and advantages of the process and the structure according to the invention will be apparent from the following description of embodiments thereof, given by way of non-limitative examples with reference to the accompanying drawings.

DETAILED DESCRIPTION OF THE INVENTION

Figure 1:
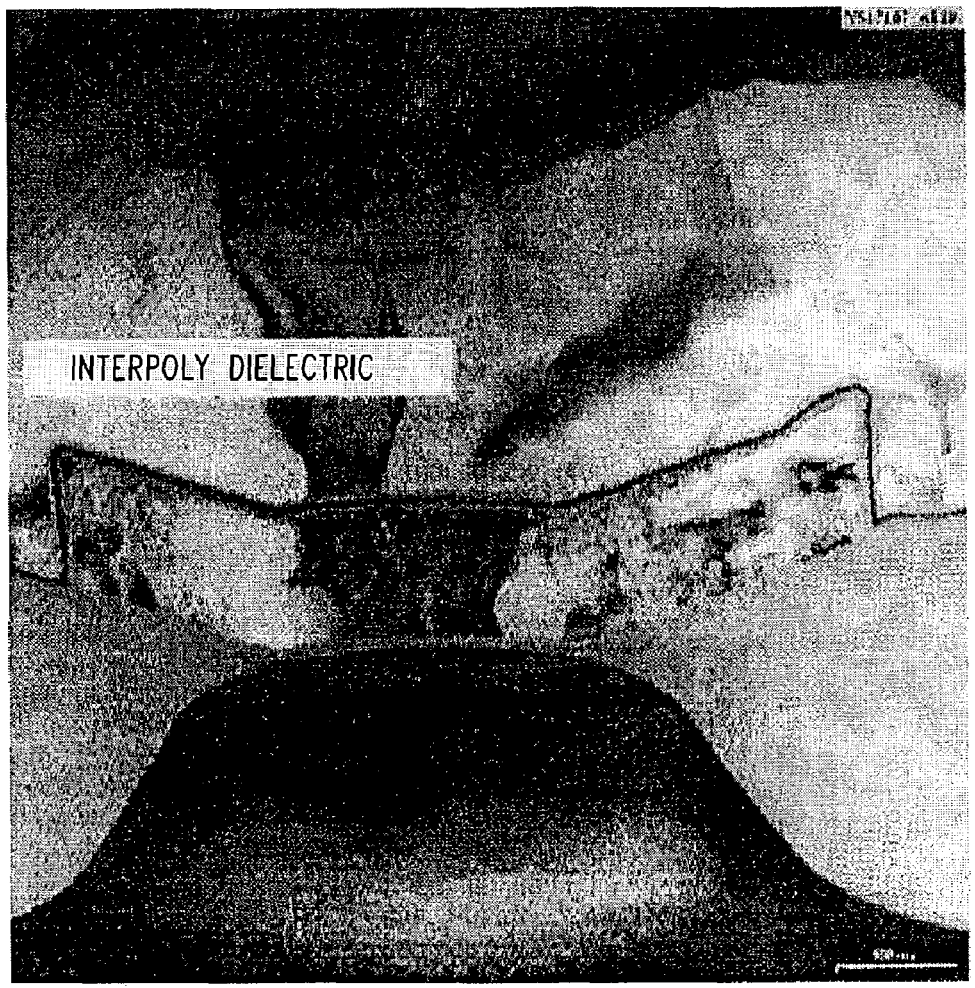
FIG. 1 shows a photo representation of a conventional flash memory cell obtained by an electron microscope.
Figure 2:
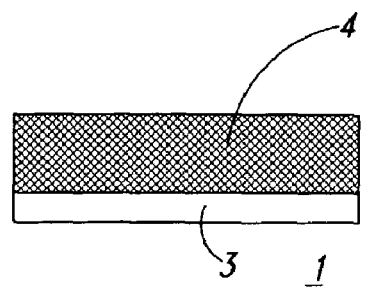
FIGS. 2 to 7 are schematically enlarged vertical cross-section views taken through a portion of a flash memory cell during a process according to an embodiment of the invention.
Figure 3:
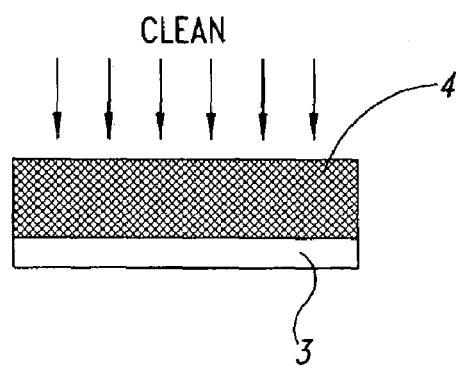

Referring to FIGS. 1 and 2, and particularly to the example shown in FIG. 2, a substrate of a semiconductor material, e.g., monocrystalline silicon, is generally shown at 1 in schematic form. This substrate is subjected to a series of process phases as provided by a method according to an embodiment of this invention.

The process phases and the structures described hereinafter do not form a complete process flow for manufacturing integrated circuits. Indeed, the invention can be used in combination with currently used integrated circuits manufacturing techniques, and only such conventional steps as are necessary to an understanding of this invention will be discussed here.

Drawing views that show cross-sections through portions of an integrated circuit during its manufacturing are not drawn to scale, but rather to highlight important features of the invention.

The process of forming an interpoly dielectric layer 2 for a non-volatile flash memory cell is carried out according to the steps hereafter described. It should be noted that the step of directly nitriding the amorphous or polycrystalline silicon layer is the same, and is followed by two alternative options, as concerning the dielectric depositing steps.

A first of these alternative steps is marked "a" hereinafter and involves depositing ONO interpoly dielectric by the CVD (Chemical Vapor Deposition) technique onto batch or single wafers.

The second step is marked "b" hereinafter and involves depositing single oxide interpoly dielectric by the CVD (Chemical Vapor Deposition) technique onto batch or single wafers.

1a–b A layer of tunnel oxide 3 is grown over the substrate 1 and followed by the deposition of an amorphous or polycrystalline silicon layer 4, as shown in FIG. 1.

2a–b This process step may be carried out now, or alternatively as step 5a–b below. This step exposes a mask to define the floating gate region from the silicon layer 4. Masking is followed by dry etching the amorphous or polycrystalline layer and then removing the residual resist from the wafer.

3a–b The surface of the amorphous or polycrystalline layer 4 used in forming the floating gate of the device is surface cleansed by means of chemicals in aqueous solution. This treatment is applied by either growing native chemical oxide, or by passivating said surface with Si—H bonds, or by wet or vapor HF—last, subsequent to the aqueous cleansing treatment.

4a–b Advantageously, said surface is nitrided directly using radical nitrogen, on either batch or single wafers. Radical nitrogen (N+) is obtained by subjecting $N_2$ molecules to a plasma. According to the design of the radical nitrogen generator, this technology, for example, is known as RPN (Remote Plasma Nitridation), DPN (Decoupled Plasma Nitridation), and MRG (Magnetic Radical Generator). The above direct nitriding operation is to grow a thin layer 5 of silicon nitride oxide serving dual functions:
  i) improving the interface quality between the floating gate and the interpoly dielectric; and
  ii) in those cases where the interpoly dielectric is a single oxide interpoly, preventing oxidizing chemicals, such as $O_2$, O, OH, and $H_2O$, from migrating to the floating gate during later treatments subjected to the memory device being formed.

The nitride oxide layer 5 can be regarded as a barrier layer.

Figure 4:
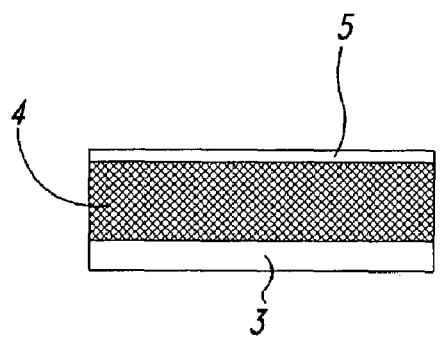
Figure 5:
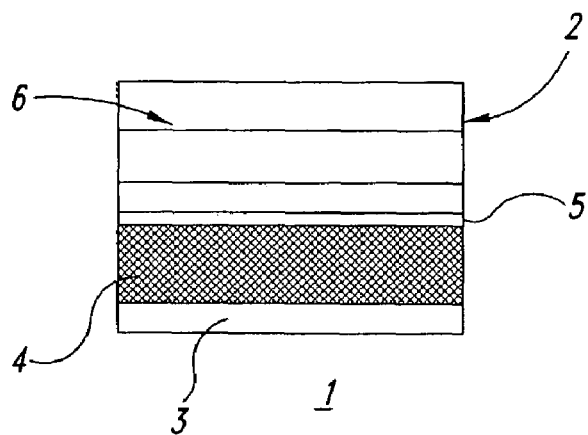
Figure 6:
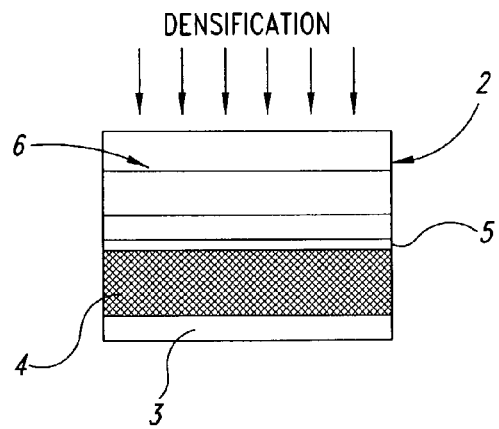

The silicon nitride oxide layer 5, obtained by direct surface nitridation of layer 4 as explained above and shown in FIG. 4, has preferably a thickness dimension of 0.5 to 5.0 nm.

The nitrogen distribution inside of said layer 5, as estimated by the SIMS/TOF-SIMS method, should be no less than $1e22$ at/cm$^3$ as peak value, for a total amount of no less than $1e15$ at/cm$^2$. The direct surface nitridation processes using radical nitrogen are carried out at temperatures of 500° to 800° C. for 30 seconds (30") to 3 minutes (3') on single wafers. Either $N_2$ alone or nitrogen/inert gas mixtures such as $N_2$/He and $N_2$/Ar may be used as the process gas.

5a–b This step is carried out, only when step 2a–b is skipped, using the same procedure as for step 2a–b.

6a The interpoly dielectric 2 can now be formed as an ONO (Oxide-Nitride-Oxide) triple layer 6, e.g., by using a CVD (Chemical Vapor Deposition) technique onto batch or single wafers. The physical thicknesses of the individual ONO layers are chosen so that the final electrical thickness of the interpoly dielectric is not greater than 130 Å.

7a Optionally, the deposited interpoly dielectric may be densified by thermal treatment using $O_2$, $N_2$, or $H_2O$ species.

Figure 7:
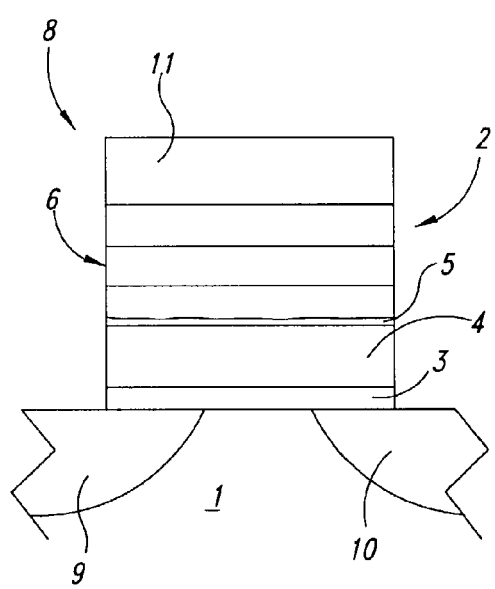

After forming the interpoly dielectric 2, the process can be extended to form a complete memory cell 8, as shown in FIG. 7. For example, source and drain regions 9, 10 can be formed in the substrate and a second polysilicon layer can be deposited and defined to form a control gate 11 according to conventional procedures. Of course, memory cell designs other than that shown in FIG. 7 could be employed with a silicon nitride barrier layer 5 without departing from the invention.

Figure 8:
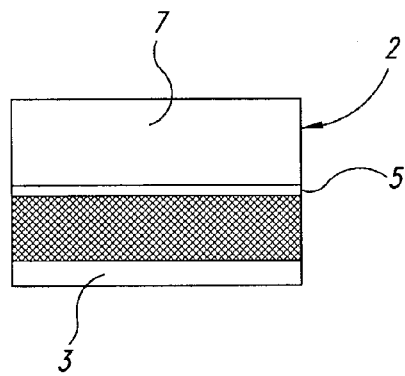
FIGS. 8 and 9 are schematically enlarged vertical cross-section views taken through a portion of a flash memory cell during a process according to a modified embodiment of the invention.

A modified embodiment of the inventive process will now be described with reference to FIGS. 8 to 9. This embodiment comprises forming a single dielectric layer 7 on top of the nitride oxide barrier layer 5. The steps described here below are alternative to steps 6a and 7a above.

6b The interpoly dielectric 2 is formed using the single oxide interpoly option, on either batch or single wafers. Briefly, a single dielectric layer 7 is deposited onto the barrier layer 5, as shown in FIG. 8. The physical thickness of layer 7 is chosen so that the final electrical thickness of the dielectric interpoly is not greater than 130 Angstroms.

Figure 9:
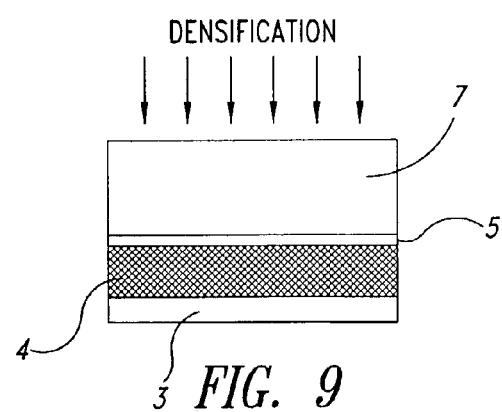

7b Optionally, the deposited single layer 7 may be densified by thermal treatment using $O_2$, $N_2$, or $H_2O$ species, as shown in FIG. 9.

The direct nitridation of the amorphous or polycrystalline silicon layer using radical nitrogen succeeds in obtaining a very thin layer having a high nitrogen content, which would be impossible to achieve by conventional nitridation techniques.

By providing a barrier between the floating gate and the interpoly dielectric, the dielectric quality is improved such that the overall thickness of the layer can be reduced to 130 Angstroms or even more. Also, the resistance of said layer to oxidizing species allows an interpoly dielectric to be inserted which comprises a single oxide interpoly layer, and this even in devices for which the process provides subsequent oxidizing treatments.

Thus, a combination of the nitridation technique with conventional CVD, in order to form the interpoly dielectric in either of the aforementioned options (i.e., ONO interpoly or single oxide interpoly), affords a significant advantage over prior art methods. This advantage is that of the reduction of the overall electrical thickness of the interpoly dielectric, down to 130 Angstroms or less while keeping the charge retention capability of the memory device unchanged.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The claimed is:

1. A process for manufacturing a non-volatile memory cell of a semiconductor device, comprising:
    forming source and drain regions in a semiconductor substrate; and
    forming a gate stack on the semiconductor substrate by steps including:
        depositing a thin oxide layer onto the semiconductor substrate;
        depositing a silicon layer onto said thin oxide layer to form a floating gate region of the memory cell, the floating gate region including an entire top surface;
        directly nitriding the entire top surface of said floating gate region, thereby forming a barrier layer of silicon nitride oxide on the entire top surface of the floating gate region;
        depositing a dielectric layer directly on the barrier layer formed by directly nitriding the entire top surface of the floating gate region such that no portion of the dielectric layer contacts the silicon layer; and
        forming a conductive layer on the dielectric layer;
        wherein a nitrogen distribution inside the silicon nitride oxide layer, formed by direct nitridation, is no less than 1e22 at/cm$^3$ as peak value, for a total amount of no less than 1e15 at/cm$^3$.

2. A process according to claim 1, wherein the thickness of the silicon nitride oxide layer, formed by direct nitridation, varies between 0.5 to 5.0 nm.

3. A process according to claim 1, wherein the dielectric layer is etched, on either batch or single wafers systems, subsequently to said direct nitridation step.

4. A process according to claim 1, further comprising dry etching the silicon layer to define the floating gate region of the cell immediately before said direct nitridation step.

5. A process according to claim 1, further comprising masking and dry etching the silicon layer to define the floating gate region of the cell immediately after the direct nitridation step.

6. A process according to claim 1, wherein the dielectric layer includes a triple ONO layer formed by CVD.

7. A process according to claim 6, wherein an overall thickness of the silicon nitride oxide layer and the triple ONO layer, is equal to or less than 130 Angstroms.

8. A process according to claim 6, further comprising densifying said triple ONO layer by heat treatment under an $N_2$, $H_2O$ and $O_2$ atmosphere.

9. A process according to claim 1, wherein the dielectric layer includes a single layer of silicon oxide formed by CVD.

10. A process according to claim 9, wherein an overall electrical thickness of the silicon nitride oxide layer and the single layer of silicon oxide is equal to or less than 130 Angstroms.

11. A process according to claim 9, further comprising densifying said single layer of silicon oxide by heat treatment under an $N_2$, $H_2O$ and $O_2$ atmosphere.

12. A process for manufacturing a non-volatile memory cell of a semiconductor device, comprising:
    forming source and drain regions in a semiconductor substrate; and
    forming a gate stack on the semiconductor substrate by steps including:
        forming a thin dielectric layer on the semiconductor substrate;
        forming a first conductive layer on said thin dielectric layer, the first conductive layer forming a floating gate region having an entire top surface;
        directly nitriding an entire top surface of the floating gate region, using radical nitrogen, thereby forming a barrier layer on the entire top surface of the floating gate region;
        forming an interlevel dielectric layer directly on the barrier layer, whereby the barrier layer intervenes between the interlevel dielectric layer and the floating gate region such that no portion of the floating gate region contacts the interlevel dielectric layer; and
        forming a second conductive layer on the interlevel dielectric layer, wherein the barrier layer includes silicon nitride oxide having a nitrogen distribution of no less than 1 e22 at/cm$^3$ as peak value, for a total amount of no less than 1e15 at/cm$^2$.

13. The process of claim 12, wherein the barrier layer includes silicon nitride oxide having a thickness between 0.5 to 5.0 nm.

14. The process of claim 12, wherein the interlevel dielectric layer is formed after forming the barrier layer.

15. The process of claim 12, further comprising etching the first conductive layer to form the floating gate region of the memory cell immediately before forming the barrier layer.

16. The process of claim 12, further comprising defining the first conductive layer to form a floating gate region of the memory cell immediately after forming the barrier layer.

17. The process of claim 12, wherein the interlevel dielectric layer includes a triple ONO layer formed by CVD.

18. The process of claim 12, wherein the interpoly dielectric includes only a single layer of silicon oxide formed by CVD.

19. A process for manufacturing a non-volatile memory cell of a semiconductor device, comprising:
    forming source and drain regions in a semiconductor substrate;
    forming a thin dielectric layer on the semiconductor substrate;

forming a first conductive layer on said thin dielectric layer;

directly nitriding a top surface of the first conductive layer, using radical nitrogen, thereby forming a barrier layer directly above and contacting a top surface of a floating gate region of the first conductive layer;

depositing an interlevel dielectric layer directly on a top surface of the barrier layer formed by directly nitriding the top surface of the first conductive layer, whereby the barrier layer intervenes between the interlevel dielectric layer and the floating gate region such that no portion of the floating gate region contacts the interlevel dielectric layer; and forming a second conductive layer on the interlevel dielectric layer;

wherein the barrier layer includes silicon nitride oxide having a nitrogen distribution of no less than 1e22 at/cm$^3$ as peak value, for a total amount of no less than 1e15 at/cm$^3$.

20. The process of claim 19, wherein the barrier layer includes silicon nitride oxide having a thickness between 0.5 to 5.0 nm.

21. The process of claim 19, wherein the interlevel dielectric layer is formed after forming the barrier layer.

22. The process of claim 19, further comprising etching the first conductive layer to form the floating gate region immediately before forming the barrier layer.

23. The process of claim 19, wherein the interlevel dielectric layer includes a triple ONO layer formed by CVD.

24. The process of claim 19 wherein directly nitriding the top surface of the first conductive layer includes directly nitriding the top surface of the first conductive layer in a manner that leaves the barrier layer covering the entire top surface of the floating gate region.

25. The process of claim 12 wherein forming an interlevel dielectric layer includes depositing an oxide layer directly on the barrier layer.

* * * * *